(12) United States Patent
Berntson et al.

(10) Patent No.: US 12,300,567 B2
(45) Date of Patent: May 13, 2025

(54) SOLID METAL FOAM THERMAL INTERFACE MATERIAL

(71) Applicant: INDIUM CORPORATION, Utica, NY (US)

(72) Inventors: Ross B. Berntson, New Hartford, NY (US); David P. Socha, Whitesboro, NY (US)

(73) Assignee: INDIUM CORPORATION, Utica, NY (US)

( * ) Notice: Subject to any disclaimer, the term of this patent is extended or adjusted under 35 U.S.C. 154(b) by 172 days.

(21) Appl. No.: 17/747,923

(22) Filed: May 18, 2022

(65) Prior Publication Data
US 2022/0375816 A1 Nov. 24, 2022

Related U.S. Application Data

(60) Provisional application No. 63/190,586, filed on May 19, 2021.

(51) Int. Cl.
*H01L 23/373* (2006.01)
*H01L 21/48* (2006.01)
(Continued)

(52) U.S. Cl.
CPC ...... *H01L 23/3733* (2013.01); *H01L 21/4882* (2013.01); *H01L 23/3672* (2013.01);
(Continued)

(58) Field of Classification Search
CPC ............. H01L 23/3733; H01L 21/4882; H01L 23/3672; H01L 23/3675; H01L 23/3735;
(Continued)

(56) References Cited

U.S. PATENT DOCUMENTS 5,150,274 A 9/1992 Okada et al.
5,323,294 A 6/1994 Layton et al.
(Continued)

FOREIGN PATENT DOCUMENTS

CN 106929733 B 6/2018
CN 108511407 A 9/2018
(Continued)

OTHER PUBLICATIONS

International Search Report and Written Opinion mailed Sep. 12, 2022 for International Application No. PCT/US2022/029901, filed on May 18, 2022.
(Continued)

*Primary Examiner* — Patricia D Valenzuela
(74) *Attorney, Agent, or Firm* — Sheppard, Mullin, Richter & Hampton LLP

(57) ABSTRACT

Solid metal foam thermal interface materials and their uses in electronics assembly are described. In one implementation, a method includes: applying a thermal interface material (TIM) between a first device and a second device to form an assembly having a first surface of the TIM in in touching relation with a surface of the first device, and a second surface of the TIM opposite the first surface in touching relation with a surface of the second device, the TIM comprising a solid metal foam and a first liquid metal; and compressing the assembly to form an alloy from the TIM that bonds the first device to the second device.

16 Claims, 11 Drawing Sheets

(51) Int. Cl.
*H01L 23/00* (2006.01)
*H01L 23/367* (2006.01)
*G01R 31/28* (2006.01)
*H01L 23/42* (2006.01)

(52) U.S. Cl.
CPC ...... *H01L 23/3675* (2013.01); *H01L 23/3735* (2013.01); *H01L 24/29* (2013.01); *G01R 31/2874* (2013.01); *H01L 23/42* (2013.01); *H01L 24/16* (2013.01); *H01L 24/32* (2013.01); *H01L 24/73* (2013.01); *H01L 24/83* (2013.01); *H01L 2224/16225* (2013.01); *H01L 2224/16227* (2013.01); *H01L 2224/16238* (2013.01); *H01L 2224/29083* (2013.01); *H01L 2224/29105* (2013.01); *H01L 2224/29109* (2013.01); *H01L 2224/29111* (2013.01); *H01L 2224/29118* (2013.01); *H01L 2224/29205* (2013.01); *H01L 2224/29209* (2013.01); *H01L 2224/29305* (2013.01); *H01L 2224/29309* (2013.01); *H01L 2224/29311* (2013.01); *H01L 2224/29318* (2013.01); *H01L 2224/32225* (2013.01); *H01L 2224/32502* (2013.01); *H01L 2224/32506* (2013.01); *H01L 2224/73204* (2013.01); *H01L 2224/73253* (2013.01); *H01L 2224/83201* (2013.01); *H01L 2224/83805* (2013.01); *H01L 2924/0132* (2013.01); *H01L 2924/0133* (2013.01); *H01L 2924/0134* (2013.01); *H01L 2924/16235* (2013.01); *H01L 2924/16251* (2013.01); *H01L 2924/1632* (2013.01); *H01L 2924/16598* (2013.01)

(58) Field of Classification Search
CPC ......... H01L 24/29; H01L 24/16; H01L 24/32; H01L 24/73; H01L 24/83; H01L 2224/16225; H01L 2224/16227; H01L 2224/16238; H01L 2224/29083; H01L 2224/29105; H01L 2224/29109; H01L 2224/29111; H01L 2224/29118; H01L 2224/29205; H01L 2224/29209; H01L 2224/29305; H01L 2224/29309; H01L 2224/29311; H01L 2224/29318; H01L 2224/32225; H01L 2224/32502; H01L 2224/32506; H01L 2224/73204; H01L 2224/73253; H01L 2224/83201; H01L 2224/83805; H01L 2924/0132; H01L 2924/0133; H01L 2924/0134; H01L 2924/16235; H01L 2924/16251; H01L 2924/1632; H01L 2924/16598; H01L 23/3736; C09K 5/10; C09K 5/14
See application file for complete search history.

(56) References Cited

U.S. PATENT DOCUMENTS

| | | |
|---|---|---|
| 6,196,307 B1 | 3/2001 | Ozmat |
| 7,593,228 B2 | 9/2009 | Jarrett et al. |
| 10,607,857 B2 | 3/2020 | Berntson et al. |
| 10,672,530 B2 | 6/2020 | Ronay |
| 10,943,795 B2 | 3/2021 | Berntson et al. |
| 10,943,796 B2 | 3/2021 | Berntson et al. |
| 2002/0175403 A1 | 11/2002 | Sreeram et al. |
| 2003/0027910 A1 | 2/2003 | Misra et al. |
| 2003/0227959 A1 | 12/2003 | Balian et al. |
| 2006/0000591 A1 | 1/2006 | Adams et al. |
| 2006/0137862 A1 | 6/2006 | Huang et al. |
| 2006/0157223 A1 | 7/2006 | Gelorme et al. |
| 2008/0023665 A1 | 1/2008 | Weiser et al. |
| 2008/0166492 A1 | 7/2008 | Lu et al. |
| 2008/0191729 A1* | 8/2008 | Blanco ............... G01R 31/2874 324/750.08 |
| 2011/0061848 A1 | 3/2011 | Chiou et al. |
| 2013/0120939 A1 | 5/2013 | Voss et al. |
| 2013/0134591 A1 | 5/2013 | Sakamoto et al. |
| 2013/0224510 A1* | 8/2013 | Deng ...................... H01L 23/42 428/576 |
| 2015/0077941 A1 | 3/2015 | Hosseini et al. |
| 2018/0301392 A1 | 10/2018 | Stegmeier |
| 2019/0301814 A1* | 10/2019 | Lin ....................... H01M 4/666 |
| 2020/0211920 A1 | 7/2020 | Lee et al. |
| 2021/0233832 A1 | 7/2021 | Uppal et al. |

FOREIGN PATENT DOCUMENTS

| | | |
|---|---|---|
| CN | 112694858 A | 4/2021 |
| EP | 2883930 A1 | 6/2015 |
| WO | WO 2015/104954 | 3/2017 |

OTHER PUBLICATIONS

Non-final Office Action dated Aug. 30, 2024 for U.S. Appl. No. 17/747,932.

Indium Corporation, "Thermal Management: Why Indium is the Best Choice," Feb. 29, 2016, 5 pages. https://www.indium.com/blog/thermal-management-why-indium-is-the-best-choice.php.

Final Office Action dated Feb. 19, 2025 for U.S. Appl. No. 17/747,932.

* cited by examiner

SOLID METAL FOAM THERMAL INTERFACE MATERIAL

CROSS-REFERENCE TO RELATED APPLICATIONS

The present application claims the benefit of U.S. Provisional Patent Application No. 63/190,586 filed on May 19, 2021 and titled "SOLID METAL FOAM THERMAL INTERFACE MATERIAL," which is incorporated herein by reference in its entirety.

DESCRIPTION OF THE RELATED ART

Heat dissipation is a key factor in the longevity and reliability of semiconductor and power devices. As semiconductor devices decrease in size and increase in performance, heat exchangers or heat sinks (sometimes also referred to as heat spreaders or lids) have become more common in various applications to provide a mechanism for heat dissipation. Thermal interface materials are commonly used between the heat-producing semiconductor device and its associated heatsink. Thermal interface materials can be used to provide a more efficient and reliable conduction of heat from the device to the heatsink. Common thermal interface materials are metal-based, which means they have a very high conductivity as compared to polymer-based thermal interface materials.

Indium metal is often used as a thermal interface material due to a combination of properties: 1) relatively high thermal conductivity compared to competing thermal interface materials, 2) a low flow-stress/high degree of malleability, 3) acceptable mechanical strength for this type of application without an external mechanical fixturing mechanism, and 4) it is a solid material that will not move outside the bond area or develop air pockets during normal use. Indium's ductility and thermal conductivity make it ideal as a compressible thermal interface material.

A traditional thermal interface that uses indium metal requires the semiconductor die to have a backside metallization. This metallization is typically made up of three parts: 1) a reactive layer, 2) a barrier layer, and 3) a passivation layer. A common metallization for the backside of an integrated circuit may be, for example, titanium, nickel, and gold (from die surface, respectively), although many other materials can be used to provide the same or similar functions. Indium will bond to non-metallic surfaces such as the silicon dioxide surface of a semiconductor die. It's bond strength to non-metals is high enough to provide desired mechanical attachment, but elevated process temperatures and the required scrubbing of the indium material on the die may not be feasible with these components.

Metal foams are a dispersion of gas bubbles in a metal liquid or metal solid, or alternatively, a dispersion of stabilized metal particles in an air medium. A solid metal foam is a structure with interstitial porous features, some of which may extend to the exterior surface area of the foam. Other gas-filled porous features may be entirely or partially contained within the metal semi-solid. A solid metal foam will have a density less than a metal or metal alloy from which it was formed.

Solid metal foams have been used for structural and anatomical purposes. For example, for artificial limbs, bike helmets, and other structural components, solid metal foams are desirable as they are light weight, they have a high strength to weight ratio, and they have the ability to absorb energy regardless of impact direction. Such devices can be fabricated from high strength materials such as vanadium and titanium alloys which are also unreactive and compatible with the human body. Solid metal foams have also been used as heat exchangers with a fluid and gas/fan combination. These heat exchangers transfer the heat generated by an electronic or a mechanical device to a fluid medium, often air or a liquid coolant. Such porous features are designed to remain rigid and intact such that the coolant medium can flow through the solid metal foam as a means of heat removal.

SUMMARY

Some implementations of the disclosure are directed to materials including metal foams that when deposited in a layered manner may act together as an ensemble to improve or maximize the thermal and mechanical properties desirable in a thermal interface material.

In one embodiment, a method comprises: applying a thermal interface material (TIM) between a first device and a second device to form an assembly having a first surface of the TIM in in touching relation with a surface of the first device, and a second surface of the TIM opposite the first surface in touching relation with a surface of the second device, the TIM comprising a solid metal foam and a first liquid metal; and compressing the assembly to form an alloy from the TIM that bonds the first device to the second device.

In some implementations, the first device is a heat generating device, and the second device is a heat transferring device. In some implementations, the heat generating device is a semiconductor die, and the heat transferring device is a semiconductor package lid or heat sink.

In some implementations, the solid metal foam comprises one or more interstitial porous areas extending from a first surface of the solid metal foam through a second surface of the solid metal foam opposite the first surface of the solid metal foam; and applying the TIM between the first device and the second device, comprises: placing the solid metal foam between the first device and the second device such that the second surface of the solid metal foam is in touching relation with the surface of the first device; and applying the first liquid metal on the first surface of the solid metal foam such that a portion of the first liquid metal diffuses through the one or more interstitial porous areas and onto the surface of the first device.

In some implementations, after compression, the density of the solid metal foam increases to a level less than the density of a metal or metal alloy from which the solid metal foam was formed.

In some implementations, the TIM further comprises a second liquid metal; and applying the TIM between the first device and the second device, comprises: placing the solid metal foam between the first device and the second device; applying the first liquid metal between the second device and the solid metal foam; and applying the second liquid metal between the first device and the solid metal foam.

In some implementations, compressing the assembly comprises: applying pressure to the assembly to compress the solid metal foam.

In some implementations, applying the first liquid metal between the second device and the solid metal foam, comprises: scrubbing, dispensing, or jetting the first liquid metal on the surface of the second device or a first surface of the solid metal foam; and applying the second liquid metal between the first device and the solid metal foam, comprises:

scrubbing, dispensing, or jetting the second liquid metal on the surface of the first device or a second surface of the solid metal foam.

In some implementations, the solid metal foam comprises indium or an indium alloy.

In some implementations, the first liquid metal comprises gallium; gallium and indium; gallium, indium, and tin; gallium, indium, tin, and zinc; or mixtures thereof.

In some implementations, the first liquid metal is a liquid metal foam comprising gas bubbles. In some implementations, the solid metal foam comprises one or more interstitial porous areas extending from a first surface of the solid metal foam; and applying the TIM between the first device and the second device, comprises: placing the solid metal foam between the first device and the second device; and applying the first liquid metal over the first surface of the solid metal foam such that the first liquid metal partially or fully fills the one or more interstitial porous areas.

In some implementations, the one or more interstitial porous areas comprise an oxide or coating to contain the first liquid metal.

In some implementations, during compression of the assembly, the first liquid metal alloys to the one or more interstitial porous areas, forming a resulting alloy from the TIM that has a higher viscosity than the solid metal foam, thereby limiting the movement of the alloy within the assembly and improving overall compressibility of the solid metal alloy.

In some implementations, the method further comprises: forming the solid metal foam by applying the first liquid metal to a surface of a block of indium or indium alloy.

In some implementations, the first device is a first heat transferring device, and the second device is a second heat transferring device. In some implementations, the first heat transferring device is a semiconductor package lid; and the second heat transferring device is a heat sink.

In one embodiment, a semiconductor assembly comprises: a first device; a second device; and an alloy bonding the first device to the second device, wherein the alloy is formed by: applying a TIM between the first device and the second device such that a first surface of the TIM is in touching relation with a surface of the first device, and a second surface of the TIM opposite the first surface is in touching relation with a surface of the second device, the TIM comprising a solid metal foam and a first liquid metal; and compressing the TIM to form the alloy from the TIM. For example, the first device may be a heat generating device such as a semiconductor die, and the second device may be a heat transferring device such as a semiconductor package lid or heat sink. As another example, the first device may be a first heat transferring device such as a semiconductor package lid, and the second device may be a second heat transferring device such as a heat sink.

In one embodiment, a semiconductor assembly comprises a semiconductor die; a heat exchanger; and a TIM alloy bonding the semiconductor die to the heat exchanger without using a separate metallization layer on a surface of the semiconductor die or a surface of the heat exchanger.

In some implementations, the TIM alloy is formed by: placing a TIM material between the semiconductor die and the heat exchanger, the TIM material comprising a first liquid metal foam in touching relation with the surface of the semiconductor die, a second liquid metal foam in touching relation with the surface of the heat exchanger, and a metal shim between the first liquid metal foam and the second liquid metal foam; and compressing the TIM material such that the first liquid metal foam and the second liquid metal foam alloy to the metal shim, thereby forming the TIM alloy.

In some implementations, the TIM alloy is formed by: placing a TIM material between the semiconductor die and the heat exchanger, the TIM material comprising a first liquid metal in touching relation with the surface of the semiconductor die, a second liquid metal in touching relation with the surface of the heat exchanger, and a thermally conductive metal foil between the first liquid metal and the second liquid metal; and compressing the TIM material such that the first liquid metal and the second liquid metal alloy to the thermally conductive metal foil, thereby forming the TIM alloy.

In some implementations, the TIM material comprises a first liquid metal foam and a second liquid metal foam, the first liquid metal is a component of first liquid metal foam, and the second liquid metal is a component of the second liquid metal foam In some implementations, the metal shim consists of indium or an indium alloy.

In some implementations, the thermally conductive foil consists essentially of indium or an indium alloy.

Other features and aspects of the disclosed technology will become apparent from the following detailed description, taken in conjunction with the accompanying drawings, which illustrate, by way of example, the features in accordance with implementations of the disclosed technology. The summary is not intended to limit the scope of any inventions described herein, which are defined by the claims and equivalents.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF THE DRAWINGS

The present disclosure, in accordance with one or more implementations, is described in detail with reference to the following figures. The figures are provided for purposes of illustration only and merely depict example implementations. Furthermore, it should be noted that for clarity and ease of illustration, the elements in the figures have not necessarily been drawn to scale.

Some of the figures included herein illustrate various implementations of the disclosed technology from different viewing angles. Although the accompanying descriptive text may refer to such views as "top," "bottom" or "side" views, such references are merely descriptive and do not imply or require that the disclosed technology be implemented or used in a particular spatial orientation unless explicitly stated otherwise.

The figures are not exhaustive and do not limit the present disclosure to the precise form disclosed.

DETAILED DESCRIPTION OF THE EMBODIMENTS

When removing heat from a semiconductor device, a metal foam may be desirable due to its high surface area. Unlike solid metal foams used for heat structural, anatomical, and/or heat exchanging purposes, it may be desirable to have a thermal interface solid metal foam which is compressible, deformable, and reactive, coupled with a high thermal conductivity and low thermal resistance. To this end, implementations of the disclosure are directed to materials including metal foams that when deposited in a layered manner may act together as an ensemble to improve or maximize the thermal and mechanical properties desirable in a thermal interface material. In addition to the properties described above, the materials described herein may eliminate the need for backside metallization of a semiconductor die.

Figure 1A:
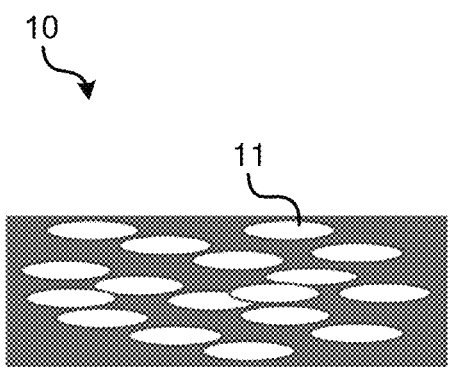
FIG. 1A depicts a cross-sectional view of closed cell solid metal foam, in accordance with implementations of the disclosure.
Figure 1B:
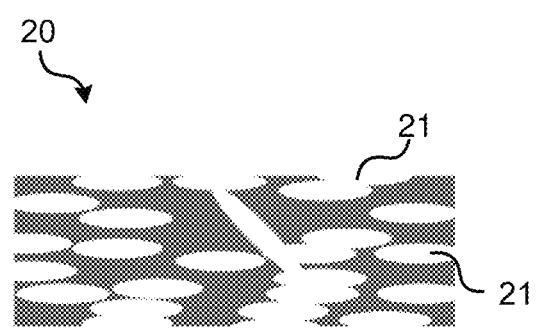
FIG. 1B depicts a cross-sectional view of an open cell solid metal foam, in accordance with implementations of the disclosure.
Figure 1C:
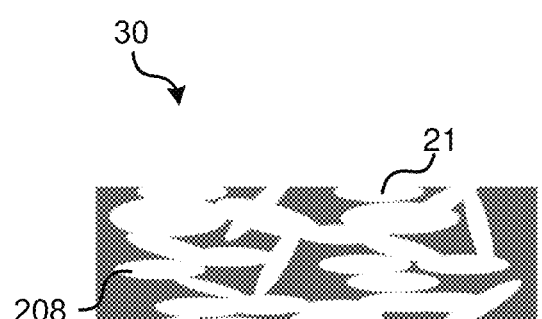
FIG. 1C depicts a cross-sectional view of a hybrid cell solid metal foam, in accordance with implementations of the disclosure.

FIGS. 1A, 1B, and 1C respectively illustrate cross-sectional views of solid metal foams 10, 20, and 30 that may be used as part of a TIM, in accordance with implementations of the disclosure. The metal foams may be rectangular (e.g., six-sided), cubic, or irregularly shaped objects implemented in TIMs used to provide heat transfer in semiconductor assemblies, further described below.

FIG. 1A depicts a closed cell solid metal foam 10. Closed cell solid metal foam 10 has interstitial porous areas or pores 11 throughout the medium but with no pores that extend to the outer surfaces.

FIG. 1B depicts an open cell solid metal foam 20. Open cell metal foam 20 has porous areas or pores 21 that extend to the outer surface of the foam. A light shined on one side of the open cell metal foam will travel through the pores 21 of the medium and emerge on the opposing side.

FIG. 1C depicts a hybrid cell solid metal foam 30, which is a combination of an open and closed metal foam. Foam 30 has interstitial porous areas or pores 31 with some sides where pores 31 extend to the outer surface(s) of foam 30, and other sides where porous areas or pores 32 do not emerge through an exterior surface of foam 30. Such surfaces where the pores extend need not necessarily be opposing sides (e.g., top and bottom of the metal foam). Like surfaces may be opposing, adjacent, or random as in the case of a more complexed-shaped object.

As further described below, a hybrid cell solid metal foam may be desirable in some implementations in that the solid metal foam may serve both as a thermal interface material and as a containment for liquid metals, liquid metal foams, greases or waxes. When dispensed on the top of the hybrid solid metal foam, the liquid metal may cascade through the porous structure and wets to the top and bottom. The closed cell portions of the hybrid solid metal foam may contain oxides or coatings to contain the liquid metal in the x and y planes and to slow solubility of the solid foam into the liquid metal.

The solid metal foam may be made by injecting gas into a molten liquid metal from an external source prior to solidification. It may also be made by causing gas formation in the liquid metal by mixing gas-releasing blowing agents with the molten metal. Following one of the above methods, the gas-filled molten metal may be reduced in temperature below its solidus temperature and allowed to cool, causing it to solidify while maintaining the porous, gaseous areas within the solid.

In another implementation, the solid metal foam may be made by compressing salt crystals such as NaCl into a mold and pouring molten metal into the top of the mold containing the salt crystals. The molten metal seeps between the salt and fills the voided areas around the salt crystals. Once the metal solidifies, the solid metal with embedded salt crystals may be removed from the mold and placed in an aqueous bath. The salt crystals dissolve in the aqueous solution leaving a porous area in each space where a solid salt crystal once resided, and what remains is a porous framed structure comprised of metal.

The solid metal foam may be made of indium, gallium, an indium alloy, a gallium alloy, or some other suitable metal or metal alloy. Indium metal is an element that has a relatively high thermal conductivity of 86 W $m^{-1}K^{-1}$ at room temperature. It is soft, malleable, and ductile. Indium metal is compressible in both solid and solid metal foam forms. The compressibility of indium is more pronounced as a solid metal foam as the interstitial pockets of air in the foam shrink in the direction of compression and expand in the plane perpendicular to the direction of compression. Such compression improves the thermal conductivity in the plane perpendicular to compression which is desirable in a heat spreader. The compression may also help to firmly secure the TIM in place and promote low contact resistance between the TIM material and the opposing sides of the device in this sandwich structure.

By virtue of the weak structural integrity of the solid metal foams described herein, deformation may occur when compressive forces are applied. This may ensure an adequate surface contact and adhesion to the opposing surfaces. During complete deformation of the interstitial porous areas, the malleable metal located just above and below each porous area of the metal foam may contract and touch to provide a contiguous metallic pathway for thermal flow by electron transport. In some implementations, the compressed solid metal foam may have a resulting density greater than the density of the uncompressed solid metal foam, but less than the density of the metal or metal alloy from which it was formed.

Since thermal conduction is increased in the direction perpendicular to the plane of compression of the metal foam, other materials may be added to a TIM including the solid metal foam to increase thermal conductivity in the compression plane as well. Such materials include phase change materials such as greases and waxes, low melting metals and metal alloys, and liquid metals such as mercury, gallium, gallium-indium alloys, and gallium-indium-tin alloys and their respective liquid metal foams. These materials may be applied to the exterior surface of the solid metal foams, to the interstitial porous sections of the metal foam (e.g., in the case of open cell or hybrid cell metal foams), or to both.

Figure 2:
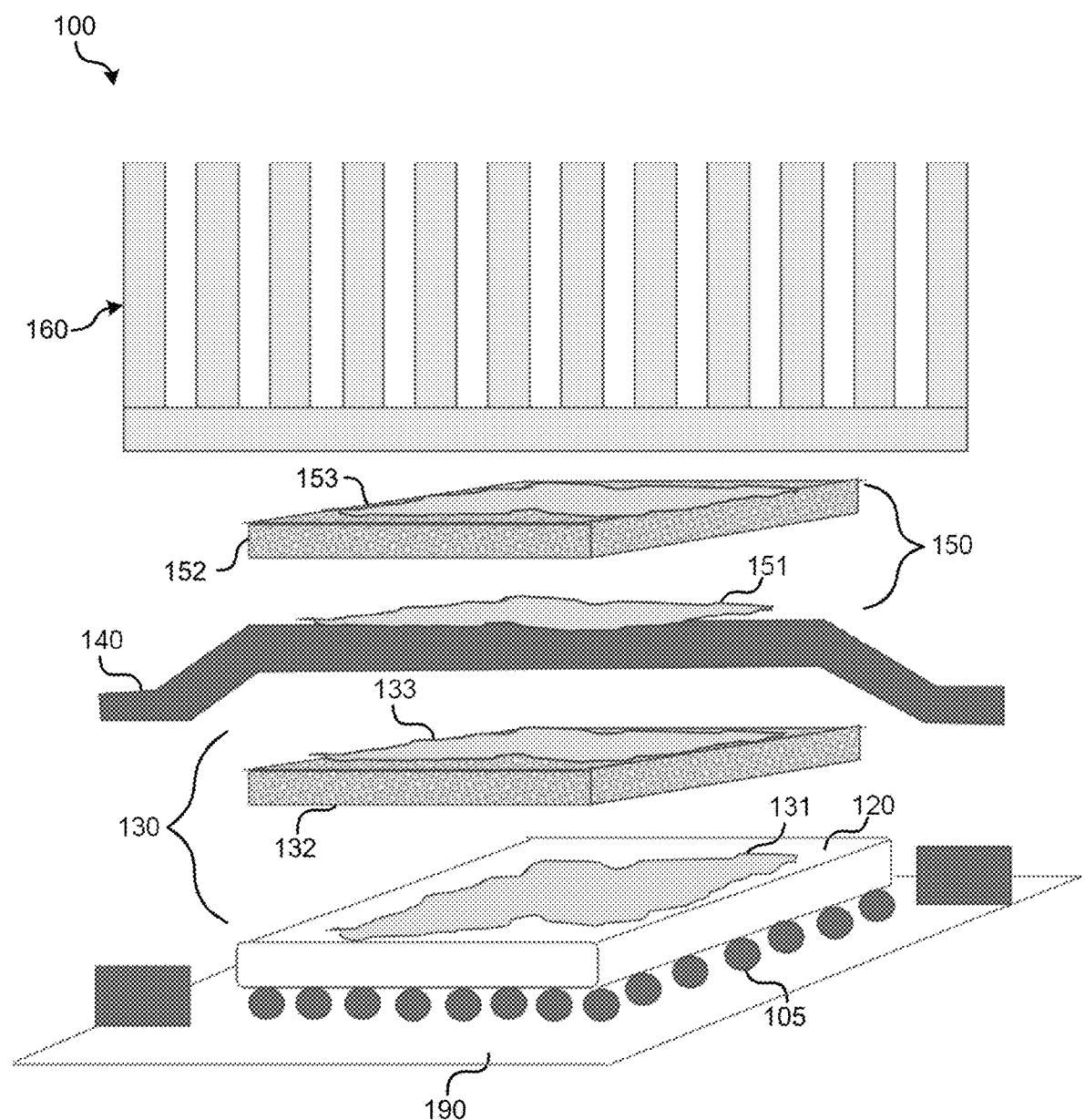
FIG. 2 shows an exploded view of components used to form a semiconductor assembly including TIM1 and TIM2 thermal interface materials, in accordance with implementations of the disclosure.

FIG. 2 shows an exploded view of components used to form a semiconductor assembly 100 including a TIM 130 and TIM 150 in accordance with implementations of the disclosure. In this example and other semiconductor assembly examples illustrated in the figures, the TIMs are used in a chip carrier depicted as a ball grid array (BGA) assembly. However, it should be appreciated that the TIMs may be utilized to provide a TIM in other semiconductor assemblies, chip carriers, or surface-mount packaging, including, for example, land grid arrays (LGA), pin grid arrays (PGA), and the like.

Semiconductor assembly 100 includes solder balls 105, a semiconductor die 120, a TIM 130, a semiconductor package lid 140, a TIM 150, and a heatsink 160. Attached underneath the die 120 (e.g., to a bottom side of a substrate) is an array of solder balls 105. Each of the solder balls may couple to a respective pad that may couple to an interconnect (not shown) that electrically couples to die 120. In this manner, electrical signals may be conducted between the die 120 and a printed circuit board (PCB) 190 onto which assembly 100 is placed. Semiconductor package lid or heat spreader 140 is configured to transfer energy as heat from die 120, via TIM 130, to heat sink 160, via TIM 150.

TIM 130 is configured to transfer heat generated by die 120 to semiconductor package lid 140. In this arrangement in which TIM 130 is the thermal interface material between the semiconductor die 120 and lid 140, TIM 130 may be referred to as a TIM1 thermal interface material.

TIM 150 is configured to transfer heat from heat spreader 140 to heat sink 160. In this arrangement in which TIM 150 is the thermal interface material between the semiconductor package lid 140 and heat sink 160, TIM 150 may be referred to as a TIM2 thermal interface material.

TIM 130 includes a liquid metal wetting agent 131, a solid metal foam 132, and a liquid metal wetting agent 133. Similarly, TIM 150 includes a liquid metal wetting agent 151, a solid metal foam 152, and a liquid metal wetting agent 153. In this example, solid metal foams 132 and 152 are closed cell, although advantages may be realized from using open cell or hybrid cell solid metal foams, further discussed below. Each of the solid metal foam 132 and solid metal foam 152 may be formed of a malleable metal (e.g., indium or gallium) or metal alloy (e.g., indium alloy or gallium alloy) such that its porous features fully or partially collapse during compression of the foam when placed between semiconductor die 120 and lid 140 (foam 132), or between lid 140 and heat sink 160 (foam 152), during manufacture of semiconductor assembly 100.

Liquid metal wetting agents 131, 133, 151, and 153 may comprise indium; indium alloys; gallium; gallium alloys; a combination of indium and gallium; a combination of gallium, indium, and tin; a combination of gallium indium, tin, and zinc; mixtures thereof; or other suitable liquid metals or metal alloys that can be alloyed with the metal foam when placed in surface contact with each other. For example, the liquid metals or metal alloys may be alloyed with the metal foam at or near room temperature. In some implementations, the liquid metal may be a component of liquid metal foam. In some implementations liquid metal foam may also contain gas bubbles such as air or nitrogen throughout the medium. In other implementations liquid metal foam may contain in-situ-formed gallium oxide and/or intentionally added gallium oxide In other implementations the liquid metal foam may contain intentionally added metal particles. In some implementations liquid metal foam may contain liquid metal, an alloy of liquid metal, gas bubbles, gallium oxide, solid metal particles or any combination thereof.

By way of example, room temperature liquid metals or liquid metal foams comprising Ga, GaIn, GaInSn, or GaInSnZn may spontaneously alloy with indium metal. When these liquid metals are placed in direct contact with an indium-containing solid metal foam (e.g., foam 132 or 152), the liquid gallium or gallium alloy will start to dissolve the solid indium, further weakening the porous solid metal foam. By virtue of the partial solubility of the liquid gallium in the porous, indium, solid metal foam, the combination may be transformed into an off-eutectic, semi-solid TIM with plasticity which serves to improve compressibility and z-direction thermal conductivity while maintaining the structural integrity of the fragile semiconductor chip.

In addition to alloying to the solid metal foams, liquid metal wetting agents may obviate the requirement of the semiconductor die 120 having backside metallization, lid 140 having metallization, and/or heat sink 160 having metallization. The liquid metal wetting agents may function as bond enhancing agents to facilitate bonding of the TIMs to different components of the semiconductor assembly. This may enhance the ability of a foam such an indium foam to bond to non-metals (such as, e.g., a die surface). Accordingly, embodiments described herein may provide the additional benefit of the elimination of resources used for backside die/wafer metallization, flux application or the curing process.

There are various methods that can be employed to apply liquid metal wetting agents to the device thermal stack up. The liquid metal can be scrubbed, dispensed, or jetted onto the surface(s) of the foam(s), heat sink 160, package lid 140 and/or semiconductor die 120. For example, liquid metal wetting agent 131 may be dispensed on a surface over die 120, and the liquid metal wetting agent 133 may be scrubbed over a top surface of solid metal foam 132. In implementations, further described below, it may not be necessary to apply the liquid metal to all surfaces as the liquid metal can flow through the porous areas of the solid metal foam and/or alloy with the TIM material and diffuse to the opposing side.

Figure 3:
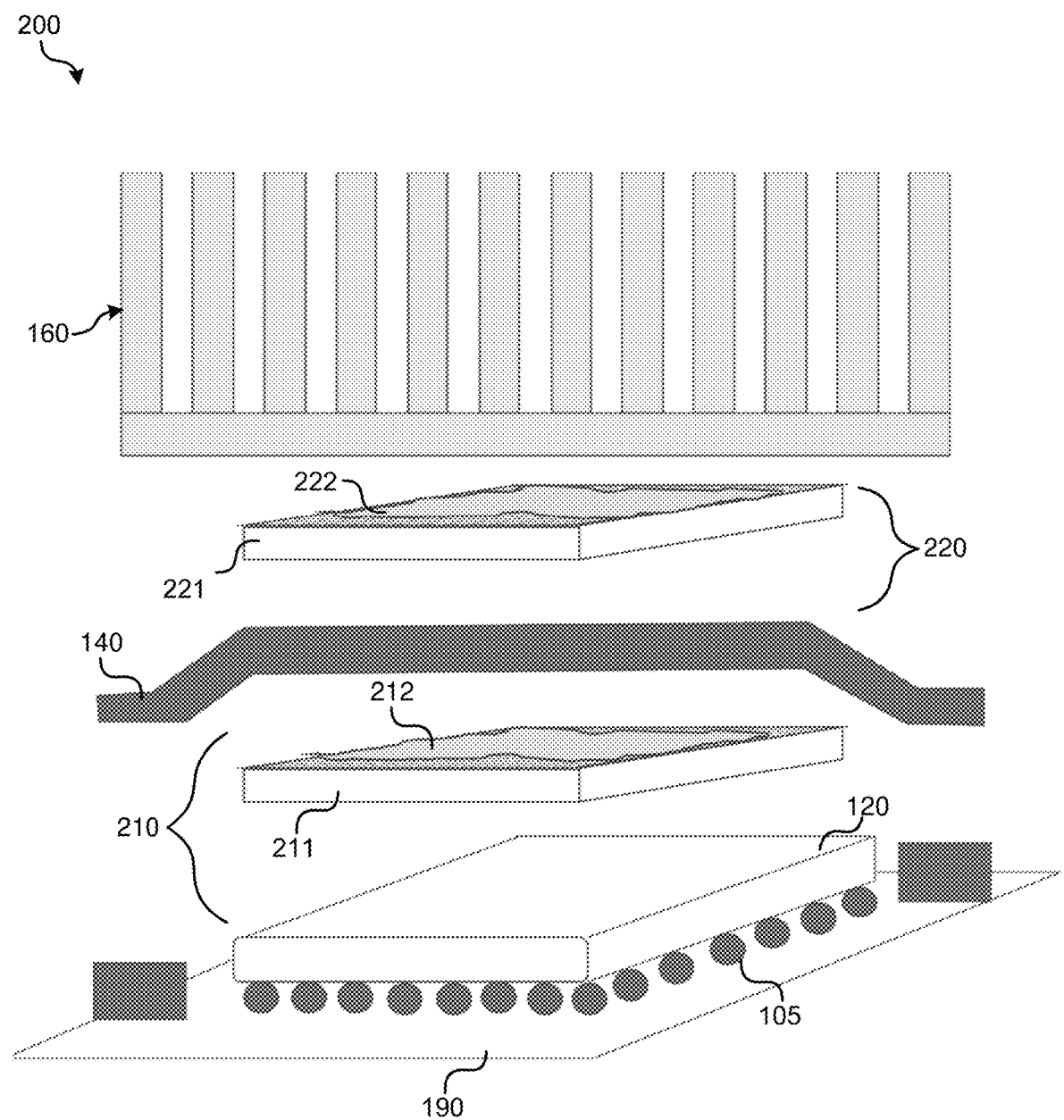
FIG. 3 shows an exploded view of components used to form another semiconductor assembly including TIM1 and TIM2 thermal interface materials, before liquid metal diffusion, in accordance with implementations of the disclosure.
Figure 4:
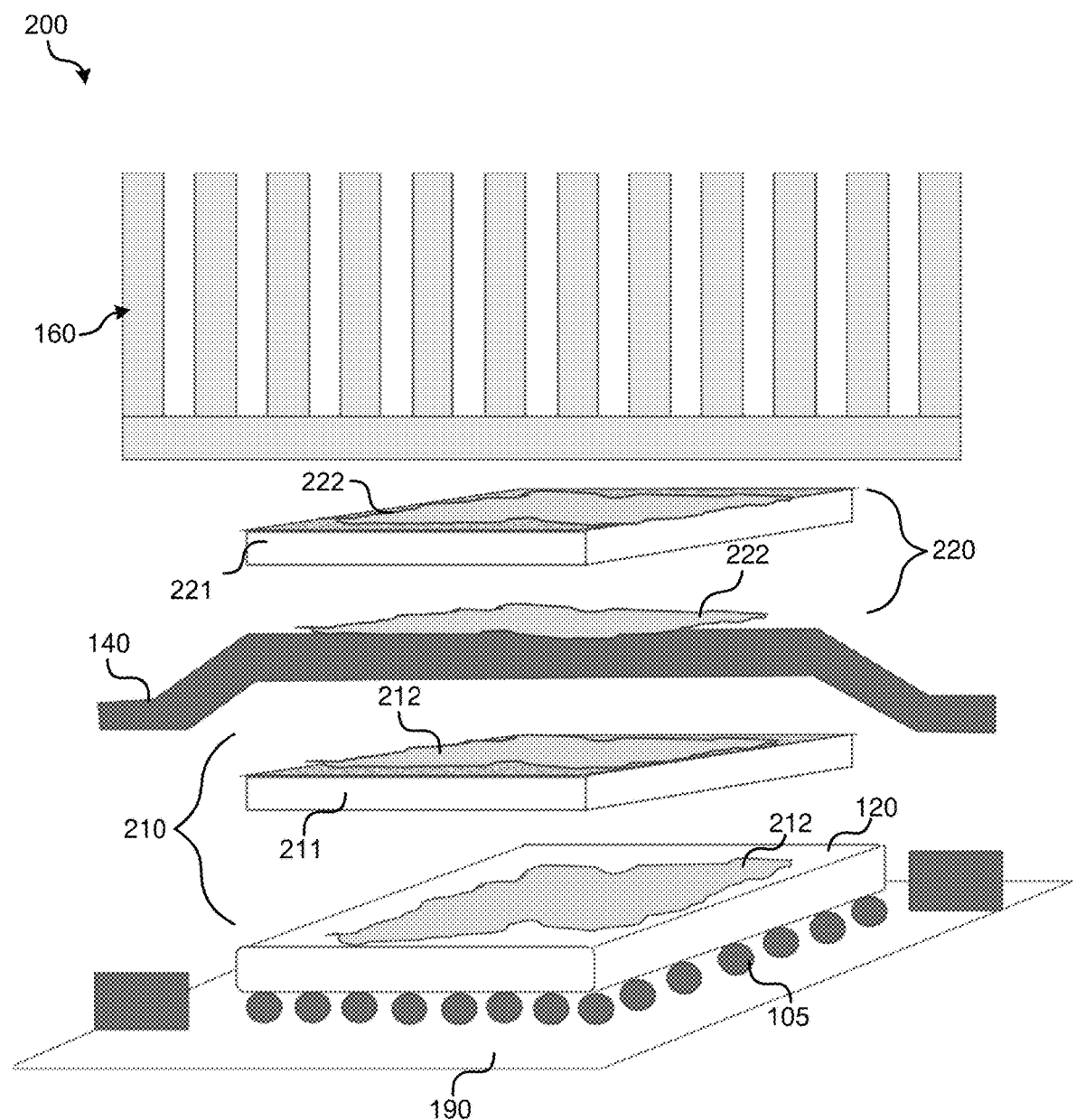
FIG. 4 shows an exploded view of components used to form another semiconductor assembly including TIM1 and TIM2 thermal interface materials, after liquid metal diffusion, in accordance with implementations of the disclosure.

FIG. 3 shows an exploded view of components used to form a semiconductor assembly 200 including a TIM 210 and TIM 220 prior to liquid metal diffusion, in accordance with implementations of the disclosure. FIG. 4 shows an exploded view of components used to form semiconductor assembly 200 including a TIM 210 and TIM 220 after liquid metal diffusion, in accordance with implementations of the disclosure. Semiconductor assembly 200 includes solder balls 105, a semiconductor die 120, a TIM 210, a semiconductor package lid 140, a TIM 220, and a heatsink 160.

In this implementation, TIM 210 includes a solid metal foam 211 and liquid metal wetting agent 212, and TIM 220 includes a solid metal foam 221, and a liquid metal wetting agent 222. The solid metal foams 211 and 221 are hybrid cell solid metal foams having a porous structure on the top and bottom TIM surfaces. This provides the advantage that it may not be necessary to separately apply liquid metal to the surface of die 120 or lid 140. Liquid metal applied over the top surface of the foam may diffuse through the topside of the porous foam TIM and wet to the underside structure, lowering the interfacial resistance of the foam and thereby improving thermal conduction in a direction perpendicular to the plane of compression of the TIM structure. FIG. 3 depicts TIMs 210 and 220 before liquid metal diffusion. FIG. 4 depicts TIMs 210 and 220 after liquid metal diffusion. As such, diffusion/alloying of the liquid metal may occur through the TIM structure in this implementation. Liquid metal wetting agents 212 and 222 may have a similar composition as described above with reference to liquid metal wetting agents 131, 133, 151, and 153.

The solid metal foam TIMs described herein may provide particular advantages in a TIM0 arrangement. In the TIM0 arrangement, the thermal interface material is located between and in direct contact with a surface of the semiconductor die and a surface of heat sink. One problem encountered in conventional TIM0 arrangements is that when a rigid material is placed on top of the semiconductor chip in the TIM0 arrangement, there is a risk of breaking the chip during placement of the heat sink on top of the rigid thermal interface material. During compression of a conventional TIM0 material, the risk of damaging the chip increases, which could result in catastrophic failure of the device. Often a soft material such as a grease, wax or liquid metal is used for the TIM0 application instead. Soft materials are chosen for TIM0 applications so that during compression the materials can deform to produce a thinner bond line as the liquid or pasty material expands in the x-y plane under the heat sink and above the semiconductor chip. Although these waxy, or liquid thermal interface materials make sufficient interfacial thermal contact with the chip and heat sink, they traditionally suffer from low thermal transport within the material itself.

To overcome these challenges, U.S. Pat. No. 7,593,228, incorporated herein by reference, describes the use of a thermally conductive patterned foil comprised of malleable metals such as lead, indium, or tin. The metal foil has a patterned surface for facilitating heat dissipation from at least one integrated circuit device to at least one heat sink. The patterned surface may deform and adapt to irregularities, especially during compression, which lessens the force on the semiconductor chip while maximizing surface contact and adhesion. While these undulating surface features of the thermally conductive patterned foil may provide some level of protection to the chip, there has been a drive in recent years to produce thinner semiconductor chips compatible with the miniaturization trend of electronic devices. These thinner devices may require additional mechanical energy absorption during compression of the TIM as the thinner chips are easier to crack under a compressive force.

Figure 5:
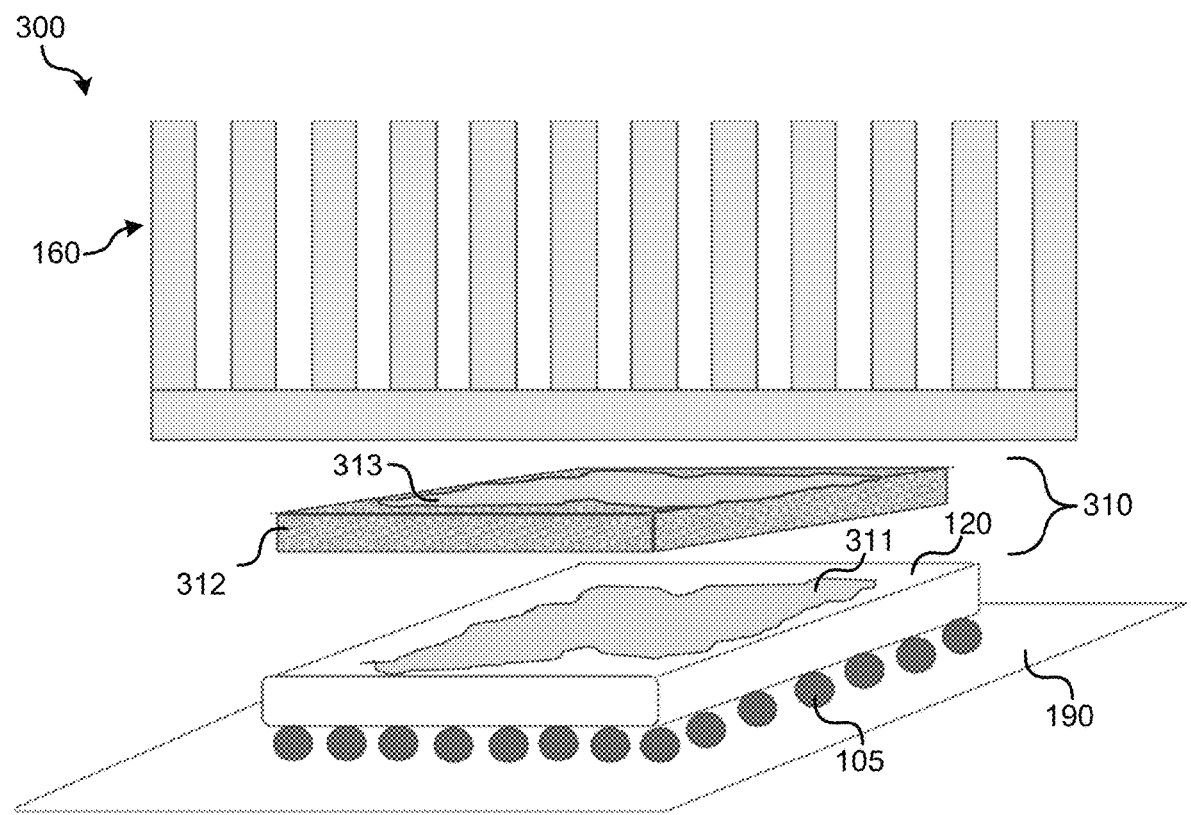
FIG. 5 shows an exploded view of components used to form a semiconductor assembly including a TIM0 thermal interface material, in accordance with implementations of the disclosure.

To this end, FIG. 5 shows an exploded view of components used to form a semiconductor assembly 300 including a TIM 310, in accordance with implementations of the disclosure. Semiconductor assembly 300 includes solder balls 105, a semiconductor die 120, a TIM 310, and a heatsink 160. TIM 310 includes a liquid metal wetting agent 311, a solid metal foam 312, and a liquid metal wetting agent 313. Solid metal foam 312 and liquid metal wetting agents 312-312 may have a similar composition and be applied in a similar manner as described above with reference to the solid foams and liquid metal wetting agents of FIGS. 1-4. The solid metal foam 312 may be closed, open, or hybrid as discussed above. In some implementations, the liquid metal wetting agents 311 and 313 are the same.

Figure 6A:
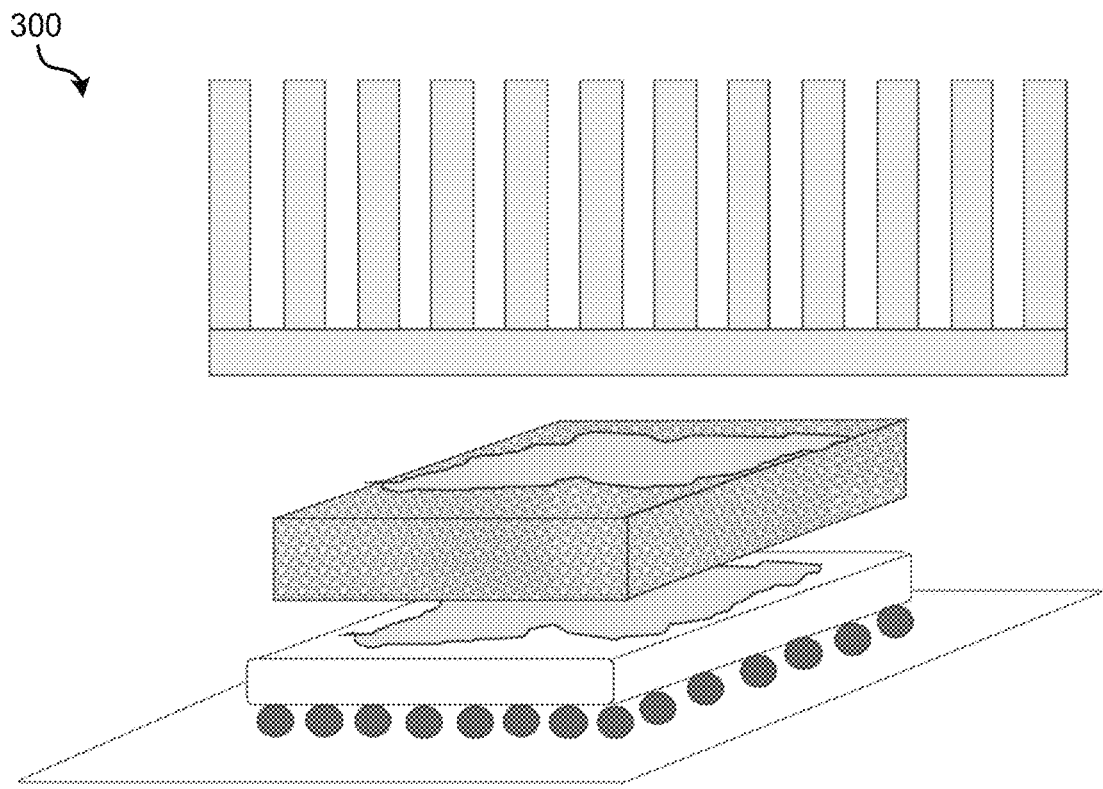
FIG. 6A illustrates the semiconductor assembly of FIG. 5 before compression of the solid metal foam with the liquid metal.
Figure 6B:
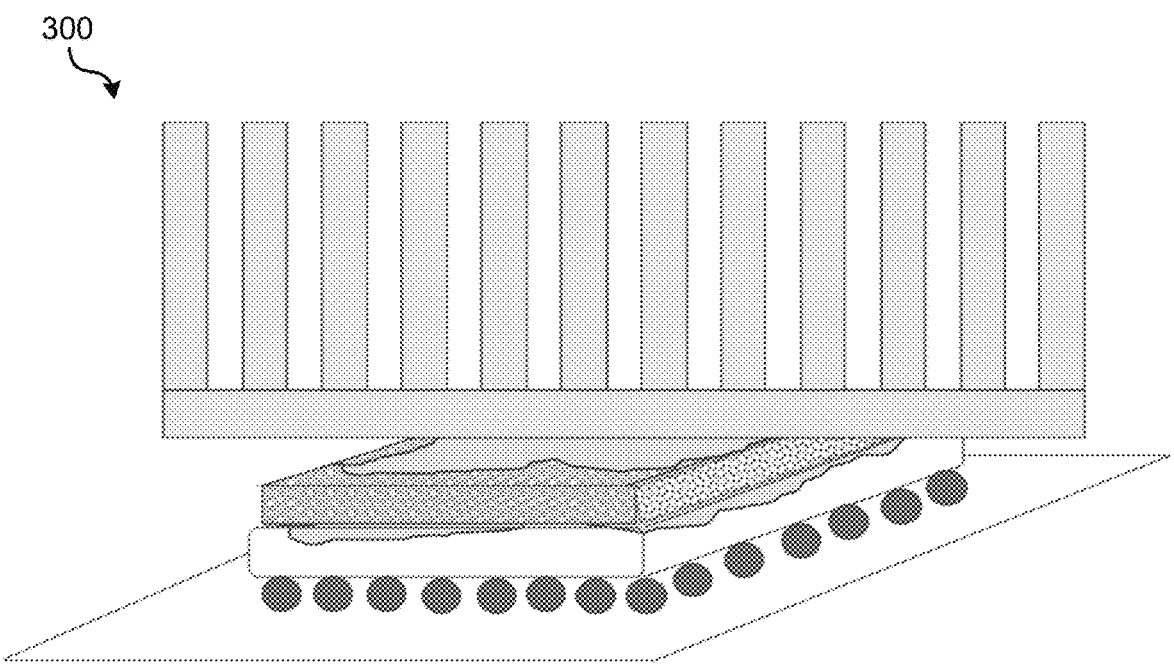
FIG. 6B illustrates the semiconductor assembly of FIG. 5 after compression of the solid metal foam with the liquid metal.

As discussed above, poor structural integrity of the TIM material (in this case, TIM 310) allows adequate deformation (and mechanical energy absorption) to occur when compressive forces are applied, ensuring adequate surface contact and adhesion to the opposing surfaces, and protecting the semiconductor chip from cracking against the compressive force. Additionally, the partial solubility of the liquid metal in the porous, solid metal foam may transform the combination into an off-eutectic, semi-solid TIM with plasticity which serves to improve compressibility and z-direction thermal conductivity while maintaining the structural integrity of the fragile semiconductor chip. As such, the TIM compositions described herein may address the aforementioned problems of semiconductor assemblies having a TIM in the TIM0 arrangement. FIGS. 6A-6B illustrate TIM 310 of semiconductor assembly 300 before compression of the solid metal foam with the liquid metal (FIG. 6A) and after compression of the solid metal foam with the liquid metal (FIG. 6B).

Figure 7:
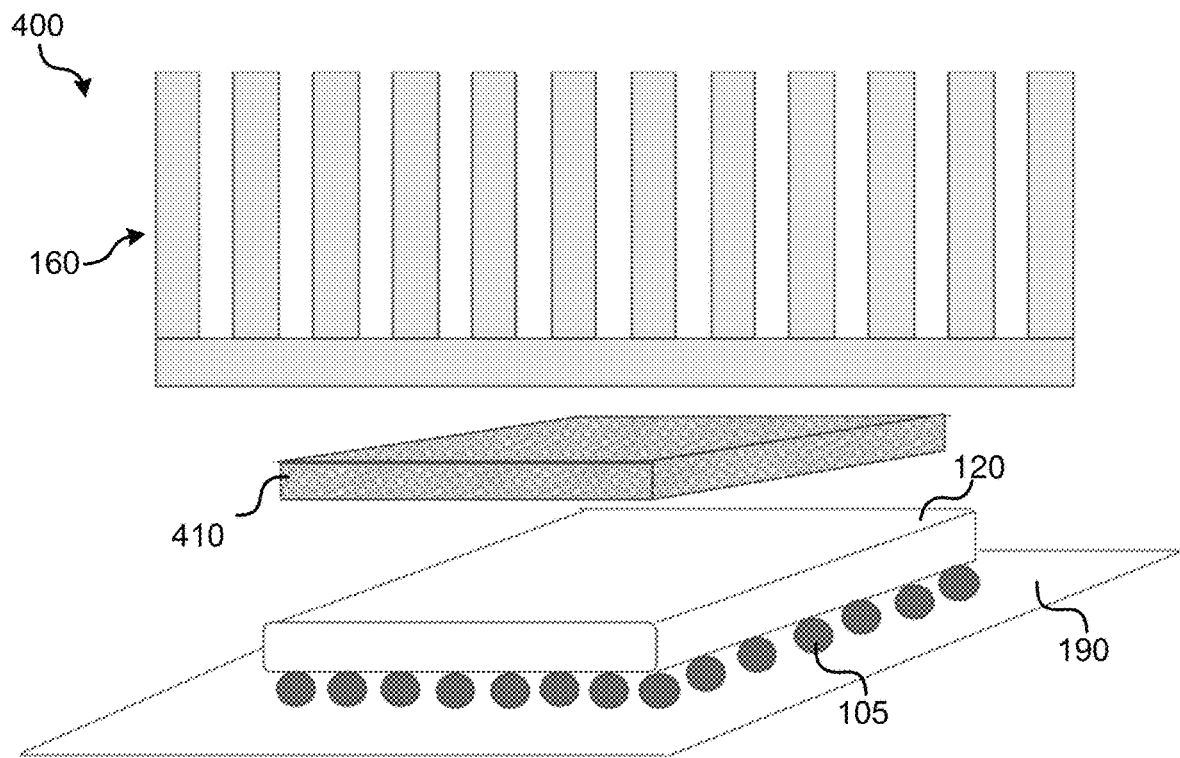
FIG. 7 shows an exploded view of components used to form a semiconductor assembly including a solid metal foam TIM0 thermal interface material, in accordance with implementations of the disclosure.
Figure 8A:
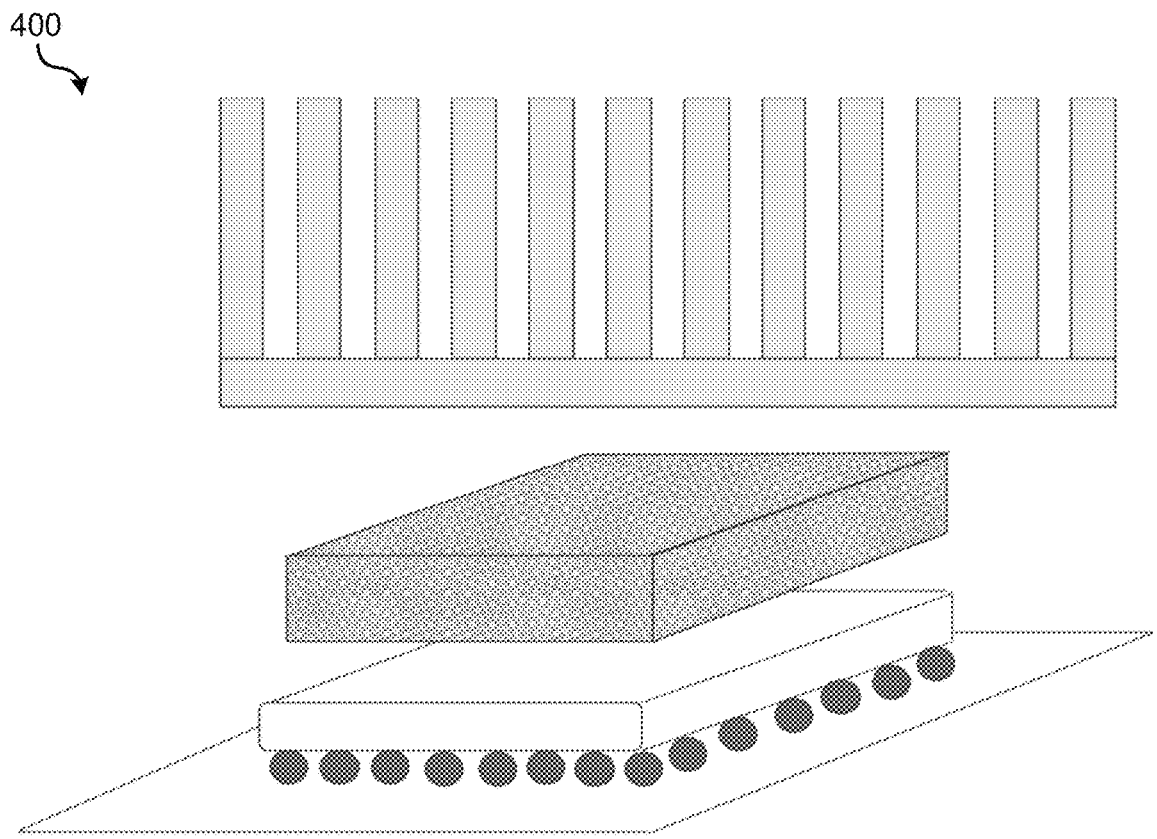
FIG. 8A illustrates the semiconductor assembly of FIG. 7 before compression of the solid metal foam.
Figure 8B:
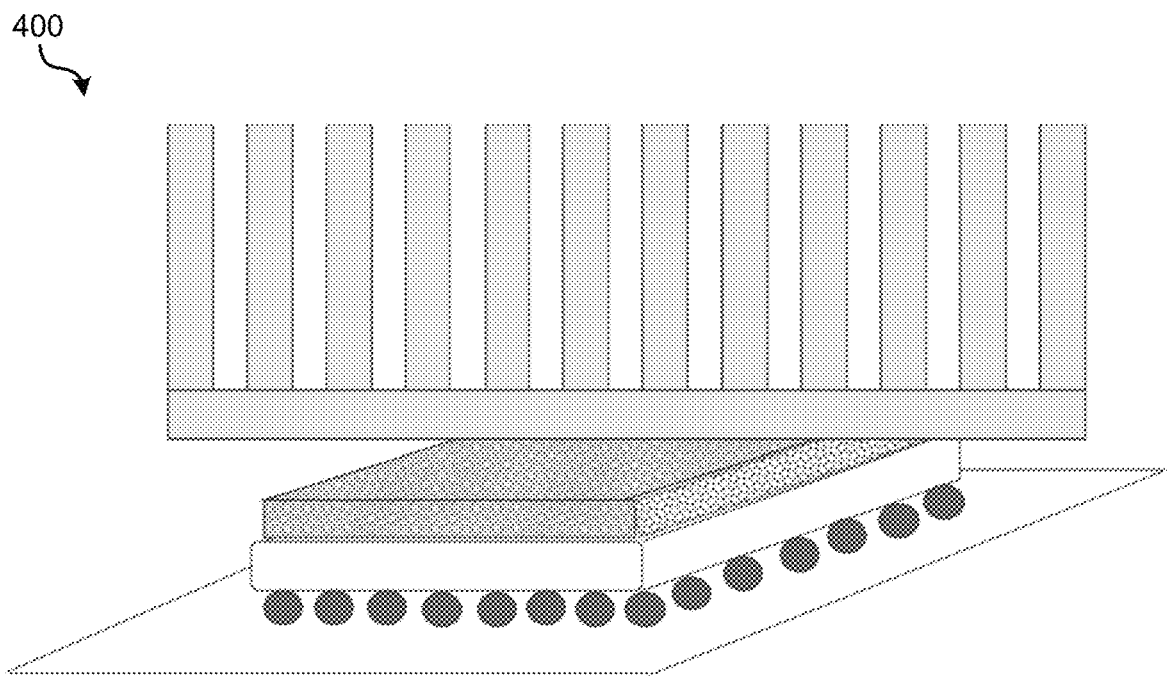
FIG. 8B illustrates the semiconductor assembly of FIG. 7 after compression of the solid metal foam.

In alternative implementations, the TIM used in the TIM0 arrangement may not include the liquid metal wetting agent(s). For example, FIG. 7 shows an exploded view of components used to form a semiconductor assembly 400 including a solid metal foam TIM 410, in accordance with implementations of the disclosure. Semiconductor assembly 400 includes solder balls 105, a semiconductor die 120, a solid metal foam 410, and a heatsink 160. FIGS. 8A-8B illustrate solid metal foam TIM 410 of semiconductor assembly 400 before compression of the solid metal foam (FIG. 8A) and after compression of the solid metal foam (FIG. 8B).

Figure 9:
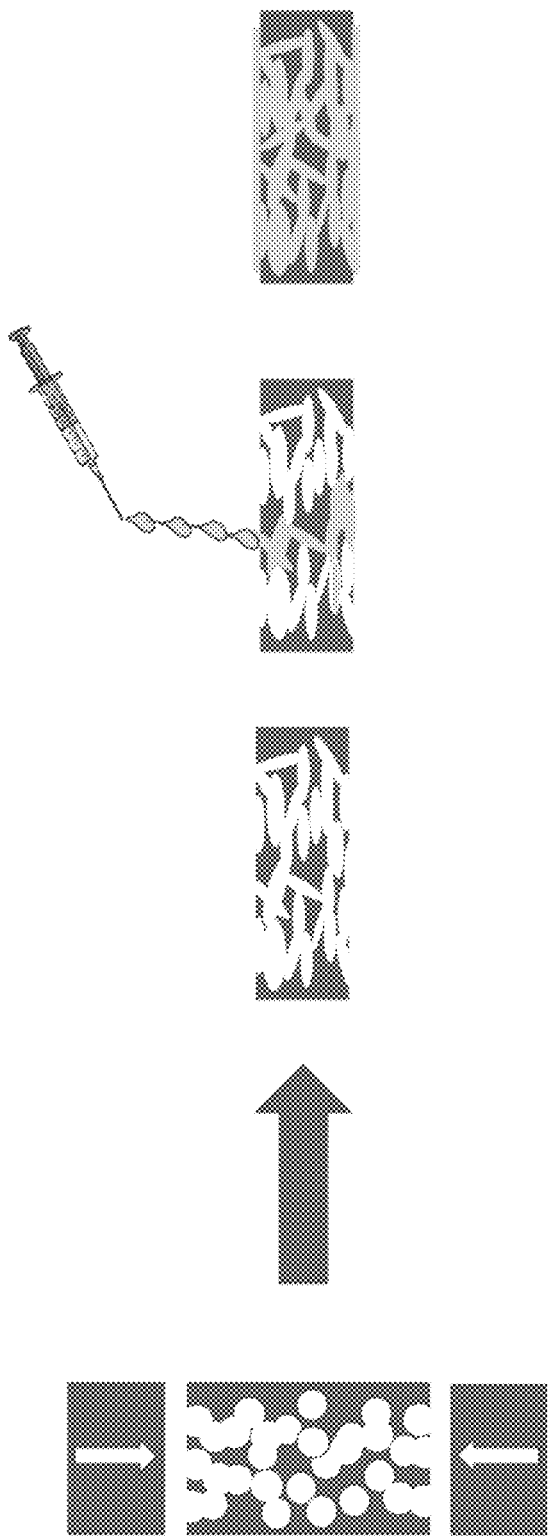
FIG. 9 depicts compression and filling of a hybrid cell metal foam with a conductive or phase change material, in accordance with some implementations of the disclosure.

FIG. 9 depicts compression and filling of a hybrid cell metal foam with a conductive or phase change material, in accordance with some implementations of the disclosure. As shown, the hybrid cell solid metal foam is compressible and liquid metal can be added to the porous features. The hybrid structure may provide the advantage of containing the liquid metal and allowing liquid metal to flow from top to bottom.

As the foregoing examples illustrate, various technical advantages may be realized by using the TIM with solid metal foam, described herein. For example, given a rectangular or cubic solid metal foam, a set of opposing sides of the six-sided TIM may remain an open celled solid metal foam while the four remaining sides in the plane of the circumference may remain closed cells. The addition of liquid metals, liquid metal foams, greases, waxes, or other phase change materials to the porous sections of the solid metal foams may serve several purposes, including: increasing thermal conductivity in the x-y plane (e.g., heat spreader); increasing thermal conductivity in the z direction parallel to semiconductor chip, lid and heat spreader; and lowering the surface resistance of a TIM1 material located between the chip and the lid and/or lowering the surface resistance of a TIM2 material included between the lid and the heat sink. In the case of a TIM0 configuration, the surface resistance may be lowered between the chip and heat sink. This in combination with the compression of the TIM material(s) can ensure adequate contact for thermal flow to occur given a temperature gradient across the device. Additionally, the solid metal foams described herein may provide the advantage of spanning gaps over heat-producing components, or providing self-leveling contact across multi-height electronic packages.

In some implementations, liquid metal foams may function as bond enhancing agents that facilitate bonding of a TIM to different components of a semiconductor assembly without the requirement of separate metallization. For example, liquid metal foams may obviate the requirement of a semiconductor die having backside metallization, a semiconductor package lid having metallization, and/or a heat sink having metallization. This may enhance the ability of an indium metal, for example, to bond to non-metals (such as, e.g., a die surface).

Figure 10:
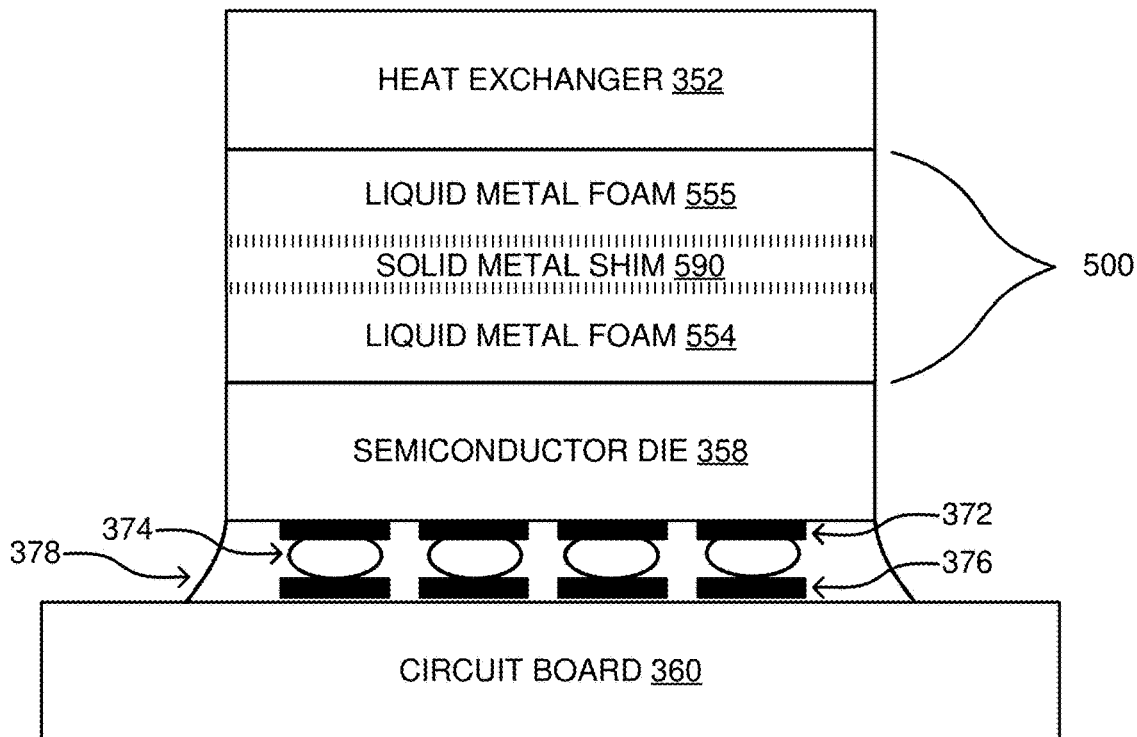
FIG. 10 illustrates an example configuration of a semiconductor assembly using a TIM including a solid metal shim sandwiched between liquid metal foams to bond a semiconductor die to a heat exchanger, in accordance with implementations of the disclosure.

To this end, FIG. 10 illustrates an example configuration of a semiconductor assembly using a TIM 500 including a solid metal shim 590 sandwiched between liquid metal foams 554, 555 to bond a semiconductor die 358 to a heat exchanger 352, in accordance with implementations of the disclosure. The heat exchanger can include a heat sink, a heat spreader, or a lid. In this example, semiconductor die 358 is mounted to circuit board 360. Solder spheres 374 were placed on metallized pads 372 of the semiconductor die 358 and reflowed to electrically connect metallized pads 372 two the electrical connectors 376 of the printed circuit board. 378 illustrates the underfill applied between the semiconductor device 358 and circuit board 360.

TIM 500 includes a liquid metal foam 554, metal shim 590, and liquid metal foam 555. The metal shim 590 may be made of indium or an indium alloy. Liquid metal foam 554 is placed directly on the surface of semiconductor die 358 to which the TIM 500 is to be bonded, and liquid metal foam 555 is placed directly on the surface of heat exchanger 352 to which the TIM 500 is to be bonded. The liquid metal foam 554 and 555 may alloy into the indium metal or indium metal alloy of shim 590 to form a TIM alloy. This may occur at room temperature, without the application of heat.

As such, in this example, backside metallization does not need to be applied to the semiconductor die 358 so that TIM 500 can be bonded to semiconductor device 358. Additionally, metallization does not need to be applied to the heat exchanger 352 so that heat exchanger 352 is joined to semiconductor die 358 with TIM 500. In alternative implementations, one of the semiconductor die 358 or heat exchanger 352 may already have metallization. In such implementations, depending on which component already has a metallization that may directly alloy to solid metal shim 590, liquid metal foam 554 or liquid metal foam 555 may be omitted from TIM 500.

The liquid metal foams 554 and 555 may comprise a mixture of gallium oxide and a gallium or gallium alloy. Gallium reacts rapidly with oxygen in air to form a thin layer of gallium oxide. When a gallium-containing liquid metal alloy is stirred, mixed, blended, shaken, or agitated by some other means, above its solidus temperature, the surface-formed metal oxide becomes dispersed throughout the liquid metal amalgam. The presence of this metal oxide in the liquid metal foam can have significant implications on the way the liquid metal flows and adheres to surfaces. The surface tension of the liquid metal/liquid metal oxide mixture is greatly reduced compared to its oxide-free counterpart. As such, the liquid metal/liquid metal oxide mixture can be ideal for use as a TIM because of its high thermal conductivity, and for its ability to spread and adhere to surfaces. In some implementations, the metal oxide is passively formed on the surface of the liquid metal while in the presence of oxygen. In some implementations, metal oxide may be intentionally added to the liquid metal alloy. In other implementations, a combination of naturally occurring and intentionally added metal oxide may be present in the same liquid metal mixture.

Figure 11:
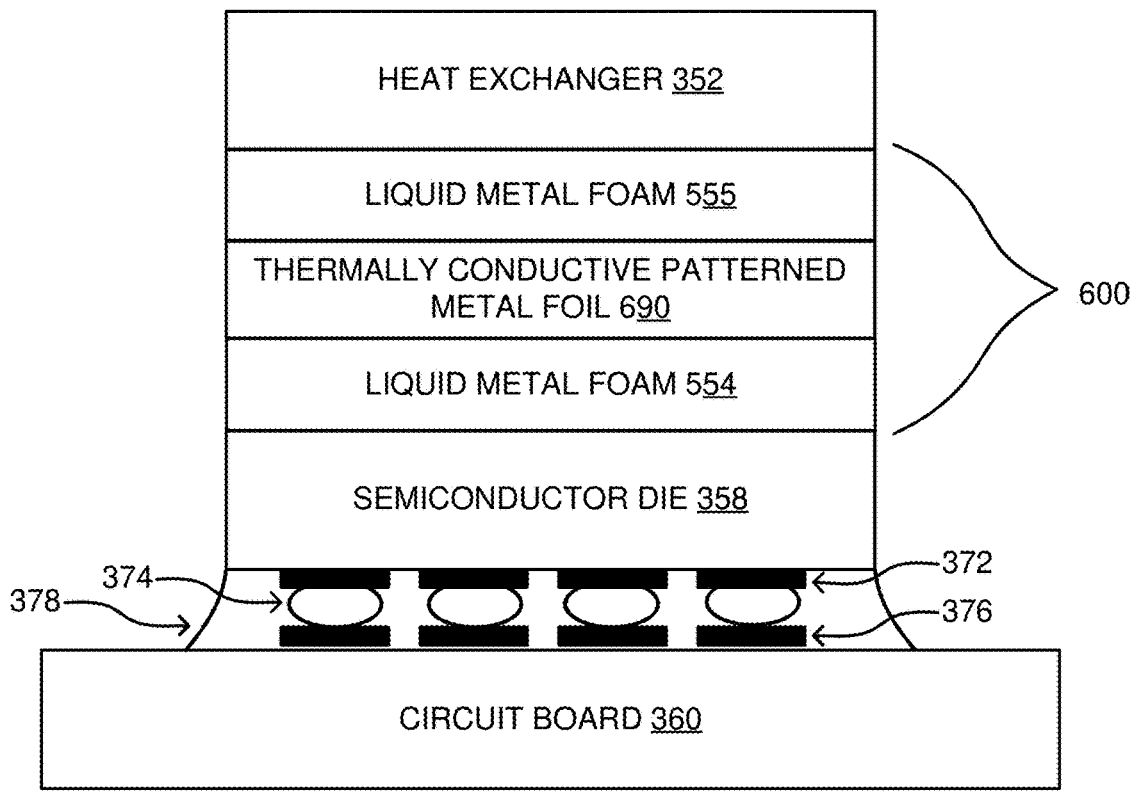
FIG. 11 illustrates an example configuration of a semiconductor assembly using a TIM including a thermally conductive patterned metal foil sandwiched between liquid metal foams to bond a semiconductor die to a heat exchanger, in accordance with implementations of the disclosure.

As another example, FIG. 11 illustrates an example configuration of a semiconductor assembly using a TIM 600 including a thermally conductive patterned metal foil 690 sandwiched between liquid metal foams 554, 555 to bond a semiconductor die 358 to a heat exchanger 352, in accordance with implementations of the disclosure.

The metal foil 690 may fabricated to have a surface texture which markedly alters the thickness of sections of the metal foil 690 to produce a pattern of peaks and valleys. Particularly, the foil may include multiple first regions and multiple second regions, the first regions having a first thickness and the second regions having a second thickness greater than the first thickness and forming a patterned surface on the thermally conductive metal foil. The pattern may be generated by roll forming or pressing the metal foil, but the pattern may also be generated by other chemical or physical methods. The thermally conductive metal foil may be configured to facilitate heat dissipation from semiconductor die 358 to heat exchanger 352, and it may be formed of indium or an indium alloy, which is deformable and adaptable to irregularities, thereby conforming to shapes of such irregularities, in at least one contact surface of die 358 and heat exchanger 352. A foil 690 made of indium or indium alloy may offer uniform thermal resistance at lower applied stresses in compressed interfaces. The malleability of indium may minimize surface resistance and increases heat flow (conductance). Additionally, the structure of foil 690 provides more compressibility than a block of pure indium metal.

In alternative implementations where one of the semiconductor die 358 or heat exchanger 352 already has metallization, liquid metal foam 554 or liquid metal foam 555 may be omitted from TIM 600.

In some implementations, to facilitate bonding of a TIM to different components of a semiconductor assembly without the requirement of separate metallization, a thermally conductive patterned metal foil made of an indium or indium alloy may be used in conjunction with liquid metals applied to non-metallized surfaces of a semiconductor die, semiconductor package lid, or heat sink. To this end, FIG. 12 illustrates an example configuration of a semiconductor assembly using a TIM 700 including a thermally conductive patterned metal foil 690 and liquid metal layers 385, 386 to bond a semiconductor die 358 to a heat exchanger 352, in accordance with implementations of the disclosure.

Liquid metal layer 385 may be applied directly on the surface of semiconductor die 358 to which the TIM 700 is to be bonded, and liquid metal layer 386 may be directly applied on the surface of heat exchanger 352 to which the TIM 700 is to be bonded. Prior to bonding of the assembly and placement of metal foil 690, the liquid metal layers may be removed, leaving respective oxide seed layers that, when alloyed with indium, result in a remaining alloy that is a solid similar to pure indium. Liquid metals that can be used to create an oxide seed layer can include, for example, indium, indium alloys, gallium, gallium alloys, alloys including a combination of indium and gallium; or the foregoing with the addition of tin in some cases.

Figure 12:
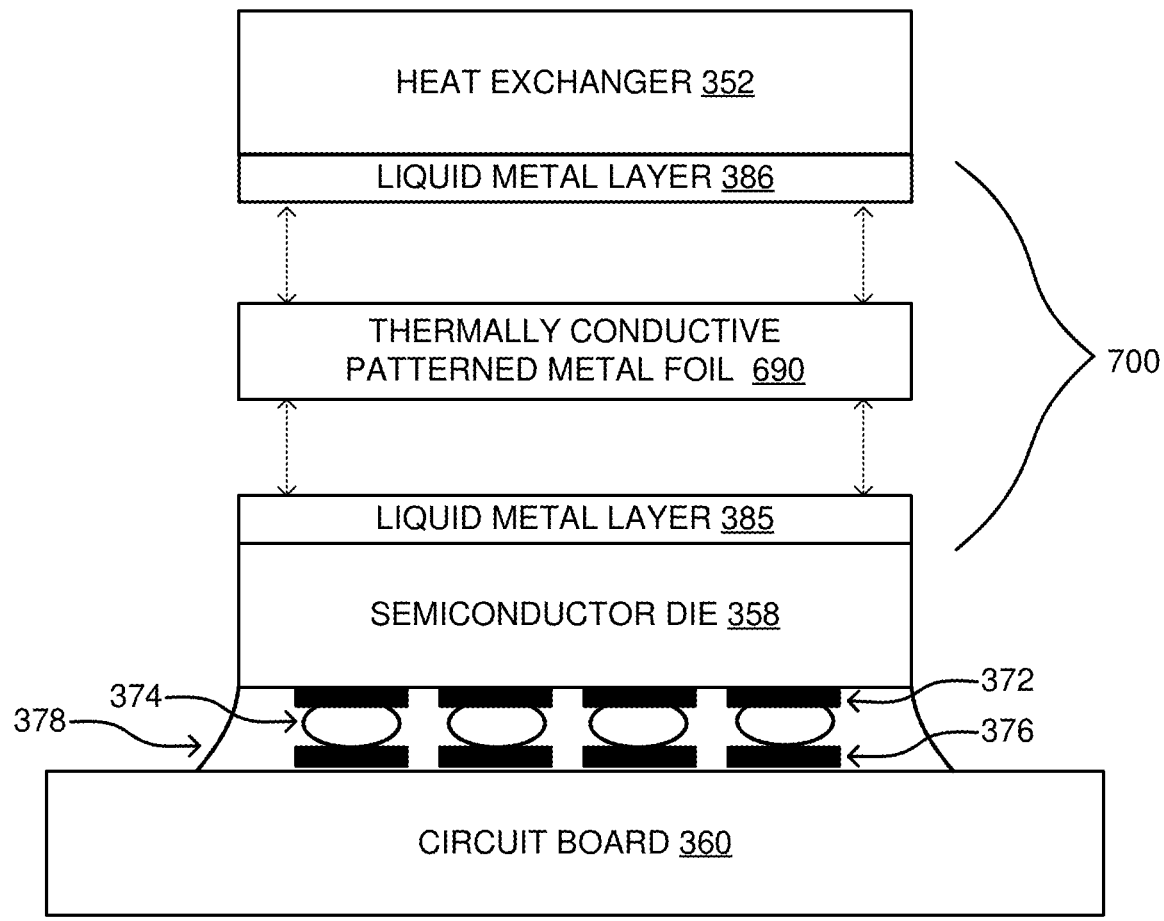
FIG. 12 illustrates an example configuration of a semiconductor assembly using a TIM including a thermally conductive patterned metal foil and liquid metal layers to bond a semiconductor die to a heat exchanger, in accordance with implementations of the disclosure.

As such, the depicted assembly of FIG. 12 can be compressed to the thermally conductive patterned foil 690 and secure heat exchanger 352 to semiconductor die 358. The oxide seed layers left on the surfaces of semiconductor die 358 and heat exchanger 352 from respectively removing liquid metal layers 385 and 386 may promote wetting of the indium metal or metal alloy of foil 690 to the bare surface of semiconductor die 358 and heat exchanger 352. Additionally, the seed layers may alloy into the indium metal or indium metal alloy of foil 690 to form a TIM alloy. In alternative implementations where one of the semiconductor die 358 or heat exchanger 352 already has metallization, liquid metal layer 385 or liquid metal layer 386 may be omitted from TIM 700.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

It should be appreciated that all combinations of the foregoing concepts (provided such concepts are not mutually inconsistent) are contemplated as being part of the inventive subject matter disclosed herein. In particular, all combinations of claimed subject matter appearing in this disclosure are contemplated as being part of the inventive subject matter disclosed herein.

What is claimed is:

1. A semiconductor assembly, comprising:
   a heat generating device;
   a heat transferring device; and
   a solid alloy bonding the heat generating device to the heat transferring device, wherein the solid alloy is formed by:
      applying a thermal interface material (TIM) between the heat generating device and the heat transferring device such that a first surface of the TIM is in touching relation with a surface of the heat generating device, and a second surface of the TIM opposite the first surface is in touching relation with a surface of the heat transferring device, wherein:
         the TIM comprises a solid metal foam and a first liquid metal;
         the solid metal foam comprises one or more interstitial porous areas extending from a first surface of the solid metal foam through a second surface of the solid metal foam opposite the first surface of the solid metal foam; and
         the TIM is applied by placing the solid metal foam such that a first surface of the solid metal foam is in touching relation with the surface of the heat generating device, and applying the first liquid metal on the first surface of the solid metal foam such that a portion of the first liquid metal diffuses through the one or more interstitial porous areas and onto the surface of the heat generating device; and
      compressing the TIM to form the solid alloy from the TIM.

2. The semiconductor assembly of claim 1, wherein the heat generating device is a semiconductor die, and the heat transferring device is a semiconductor package lid or heat sink.

3. The semiconductor assembly of claim 1, wherein the solid metal foam comprises indium or an indium alloy.

4. The semiconductor assembly of claim 3, wherein the first liquid metal comprises gallium; gallium and indium; gallium, indium, and tin; gallium, indium, tin, and zinc; or mixtures thereof.

5. The semiconductor assembly of claim 4, wherein the first liquid metal is a liquid metal foam comprising gas bubbles.

6. The semiconductor assembly of claim 1, wherein after compression, the density of the solid metal foam increases to a level less than the density of a metal or metal alloy from which the solid metal foam was formed.

7. The semiconductor assembly of claim 1, wherein:
the TIM further comprises a second liquid metal; and
applying the TIM between the heat generating device and the heat transferring device further comprises:
applying the second liquid metal between the heat generating device and the solid metal foam.

8. The semiconductor assembly of claim 1, wherein:
the solid metal foam further comprises one or more additional interstitial porous areas extending through the first surface of the solid metal foam but not through the second surface of the solid metal foam; and
applying the TIM between the heat generating device and the heat transferring device further comprises:
applying the first liquid metal over the first surface of the solid metal foam such that the first liquid metal partially or fully fills the one or more additional interstitial porous areas.

9. The semiconductor assembly of claim 8, wherein the one or more additional interstitial porous areas comprise an oxide or coating to contain the first liquid metal.

10. The semiconductor assembly of claim 8, wherein:
during compression, the first liquid metal alloys to the one or more additional interstitial porous areas; and
the solid alloy has a higher viscosity than the solid metal foam.

11. A semiconductor assembly, comprising:
a first heat transferring device;
a second heat transferring device; and
a solid alloy bonding the first heat transferring device to the second heat transferring device, wherein the solid alloy is formed by:
applying a thermal interface material (TIM) between the first heat transferring device and the second heat transferring device such that a first surface of the TIM is in touching relation with a surface of the first heat transferring device, and a second surface of the TIM opposite the first surface is in touching relation with a surface of the second heat transferring device, wherein:
the TIM comprises a solid metal foam and a first liquid metal;
the solid metal foam comprises one or more interstitial porous areas extending from a first surface of the solid metal foam through a second surface of the solid metal foam opposite the first surface of the solid metal foam; and
the TIM is applied by placing the solid metal foam such that a first surface of the solid metal foam is in touching relation with the surface of the first heat transferring device, and applying the first liquid metal on the first surface of the solid metal foam such that a portion of the first liquid metal diffuses through the one or more interstitial porous areas and onto the surface of the first heat transferring device; and
compressing the TIM to form the solid alloy from the TIM.

12. The semiconductor assembly of claim 11, wherein the first heat transferring device is a semiconductor package lid; and the second heat transferring device is a heat sink.

13. The semiconductor assembly of claim 11, wherein the solid metal foam comprises indium or an indium alloy.

14. The semiconductor assembly of claim 13, wherein the first liquid metal comprises gallium; gallium and indium; gallium, indium, and tin; gallium, indium, tin, and zinc; or mixtures thereof.

15. The semiconductor assembly of claim 14, wherein the first liquid metal is a liquid metal foam comprising gas bubbles.

16. The semiconductor assembly of claim 11, wherein after compression, the density of the solid metal foam increases to a level less than the density of a metal or metal alloy from which the solid metal foam was formed.

* * * * *